United States Patent [19]

Sakuta et al.

[11] Patent Number: 5,453,959
[45] Date of Patent: Sep. 26, 1995

[54] SEMICONDUCTOR MEMORY DEVICE HAVING A SELF-REFRESHING CONTROL CIRCUIT

[75] Inventors: Toshiyuki Sakuta, Plano, Tex.; Tomohiro Suzuki, Tsukuba, Japan

[73] Assignees: Hitachi, Ltd., Tokyo, Japan; Texas Instruments, Inc., Dallas, Tex.

[21] Appl. No.: 220,249

[22] Filed: Mar. 30, 1994

[30] Foreign Application Priority Data

Mar. 30, 1993 [JP] Japan ..................... 5-095260

[51] Int. Cl.⁶ ..................................... G11C 7/00
[52] U.S. Cl. .......................... 365/222; 365/233
[58] Field of Search ..................... 365/222, 191, 365/233, 193

[56] References Cited

U.S. PATENT DOCUMENTS 5,033,026  7/1991  Tsujimoto ............... 365/222
5,315,557  5/1994  Kim ......................... 365/222
5,329,490  7/1994  Murotani ................. 365/222

Primary Examiner—Joseph A. Popek
Assistant Examiner—Son Mai
Attorney, Agent, or Firm—Antonelli, Terry, Stout & Kraus

[57] ABSTRACT

A semiconductor memory device capable of a self-refreshing operation with a refresh-initiation signal generated in the memory device has a self-refreshing control circuit. A self-refreshing operation is automatically effected, without externally supplied clock signals, with a specific refreshing cycle having an internally set mode entry time period, a burst refresh time period and an internally set pause time period. These time periods are detected by a single counter circuit arranged to count pulses produced from a basic clock pulse signal generated by an oscillator. The burst refreshing is effected with the pulses contained in a pulse signal generated in synchronization with the basic clock pulse signal from the oscillator.

12 Claims, 15 Drawing Sheets

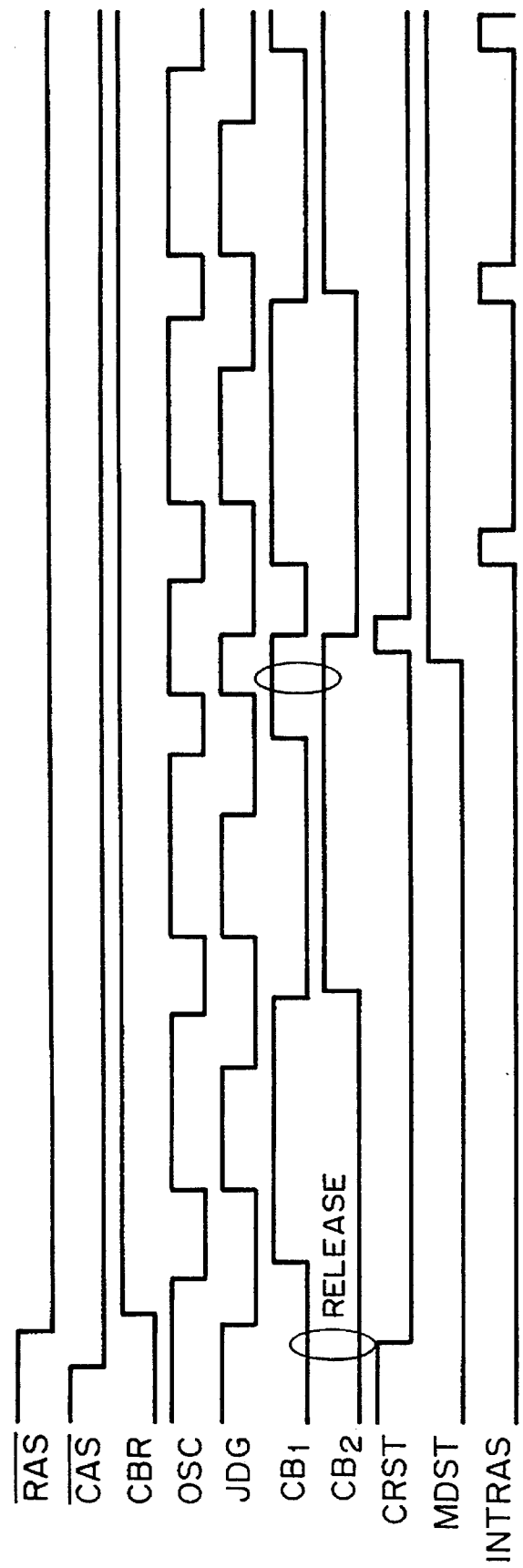

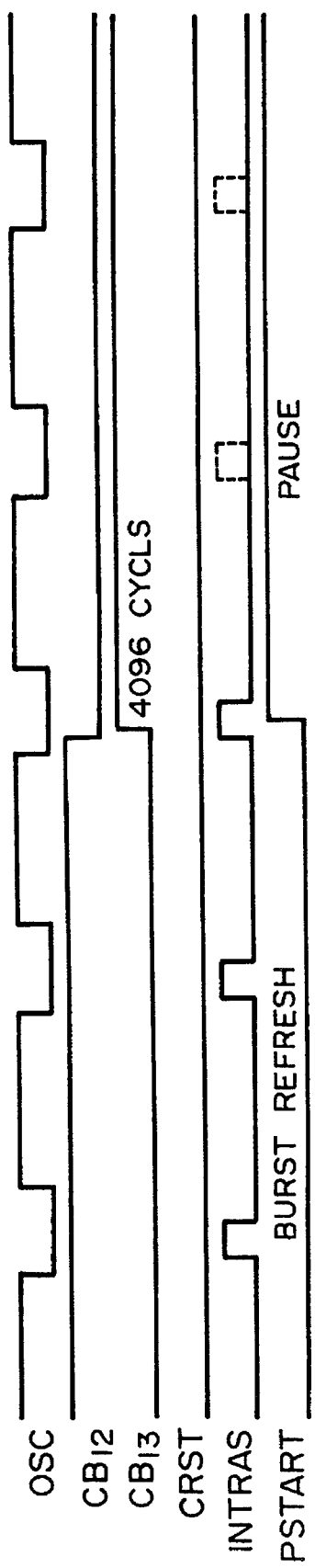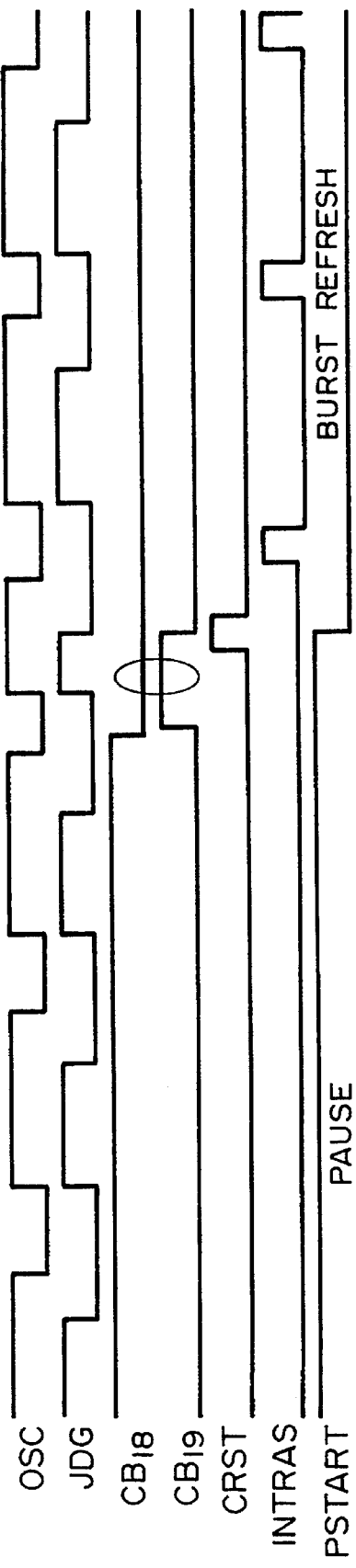

SEMICONDUCTOR MEMORY DEVICE HAVING A SELF-REFRESHING CONTROL CIRCUIT

BACKGROUND OF THE INVENTION

In dynamic type memory devices (hereafter, referred to as DRAM), a refreshing operation is carried out such that stored information is read out in a predetermined time period before the stored information disappears, and the information is amplified and thereafter rewritten into memory cells. As the refreshing operation, there are the RAS only refreshing mode with employment of the row-address strobe signal "RAS" and the CBR refreshing mode in which the column-address strobe signal "CAS" is set to a low level in advance before the row-address strobe signal "RAS" is set to a low level. The dynamic type RAMs capable of such a refreshing mode are known from, for instance, JP-A-3-14669 laid-open on Sep. 19, 1991.

SUMMARY OF THE INVENTION

Prior to the present invention, the inventors have developed a self-refreshing control circuit as illustrated in FIG. 1. This control circuit serves to determine/control timing, a refresh-period, etc. for automatically effecting refreshing by use of a pulse signal generated within a chip containing a DRAM when the CBR state continues for a predetermined time period, thereby refreshing the DRAM.

The mode-entry-time setting (measuring) counter circuit CNT1 judges that a self-refreshing mode (a refreshing operation mode without being supplied with a clock signal outside a chip) should be started when the above-explained CBR state continues over a predetermined time period. Responsive to a judgement result of this self-refreshing mode, the switch SW is changed so that the oscillating pulse from the basic oscillator "OSC1" is supplied to the refreshing-operation time counting counter circuit CNT2.

The refreshing-operation time number counting counter CNT2 counts the number of refreshing-operation in synchronism with the oscillation pulses. When one refreshing operation has been accomplished with respect to all memory cells, the switch SW is changed, so that the oscillation pulses are switched to be supplied to the maximum pause time setting counter circuit CNT3. The maximum pause time setting counter circuit CNT3 performs the timer operation by use of the oscillation pulses, to thereby repeat a refreshing time period including one refreshing-operation time performed for all of the above memory cells and the pause time.

To cope with variations of dynamic type memory devices (simply referred to a "DRAM") depending on the manufacturing process and also various specifications of DRAMs, the initial value setting fuse circuit as shown in FIG. 2 is provided in each of the counter circuits CNT1 to CNT3. In accordance with the inventors' knowledge, the counter circuits CNT1 to CNT3 set times (time periods) for judging the above-mentioned modes, set the number of refreshing operations necessary for refreshing all memory cells once in accordance with the refreshing method, and set the pause limit time, the setting being carried out in a programmable manner. For the fuse circuit itself and the counter circuits themselves, known circuits may be employed.

The inventors have further found that the entire circuit can be made simple without sacrificing its function, taking account of the fact that the counting operations are not simultaneously carried out in a parallel mode within the above-explained three counters CNT1 to CNT3.

An object of the present invention is to provide a self-refreshing control circuit for controlling refreshing of a DRAM.

Another object of the present invention is to provide a dynamic type random access memory device (DRAM) equipped with a self-refreshing control circuit of a simplified structure.

The above and other objects and novel features of the present invention will be apparent from the following description in the specification and accompanying drawings.

According to one aspect of the present invention, a counter circuit is provided for counting output pulses from a basic oscillator to produce first, second and third counting outputs, a first detecting circuit having a first programmable circuit receives the first counting output from the counter circuit to thereby detect that a predetermined signal input state continues for a set time period set by the first programmable circuit, a second detecting circuit receives the second counting output from the counter circuit to thereby detect that one refreshing of all memory cells has been completed, a third detecting circuit having a second programmable circuit receives the third counting output from the counter circuit to thereby detect that a pause time set by the second programmable circuit has elapsed, and the first to third detecting circuits are controlled by a control circuit.

According to another aspect of the present invention, a refreshing control circuit for use with a semiconductor memory device capable of a self-refreshing operation with a refresh-initiation signal generated in the memory device includes:

an oscillator for generating a basic clock pulse signal;

first means coupled to the oscillator for detecting continuation of the refresh-initiation signal at least for a predetermined threshold time duration and generating a first detection signal upon detection of the continuation, the first means having a first programmable circuit for setting the predetermined threshold time duration;

second means responsive to the first detection signal for generating refresh-timing pulses in synchronization with the basic clock pulse signal, the self-refreshing operation being effected with the refresh-timing pulses;

third means coupled to the oscillator and responsive to the first detection signal for detecting termination of one refreshing operation cycle and generating a second detection signal upon detection of the termination of the one refreshing operation cycle;

fourth means coupled to the oscillator and responsive to the second detection signal for detecting termination of a predetermined pause time duration and generating a third detection signal at least upon detection of the termination of the predetermined pause time duration; and a controller coupled to receive the first, second and third detection signals from the first, third and fourth means, respectively, for controlling the first, second, third and fourth means.

BRIEF DESCRIPTION OF THE DRAWINGS

FIG. 9 is a timing chart for explaining the operation of the self-refreshing control circuit according to an embodiment of the present invention.

FIGS. 10A and 10B are other timing charts for explaining the operations of the self-refreshing control circuit according to another embodiment of the present invention.

DESCRIPTION OF THE PREFERRED EMBODIMENTS

Figure 1:
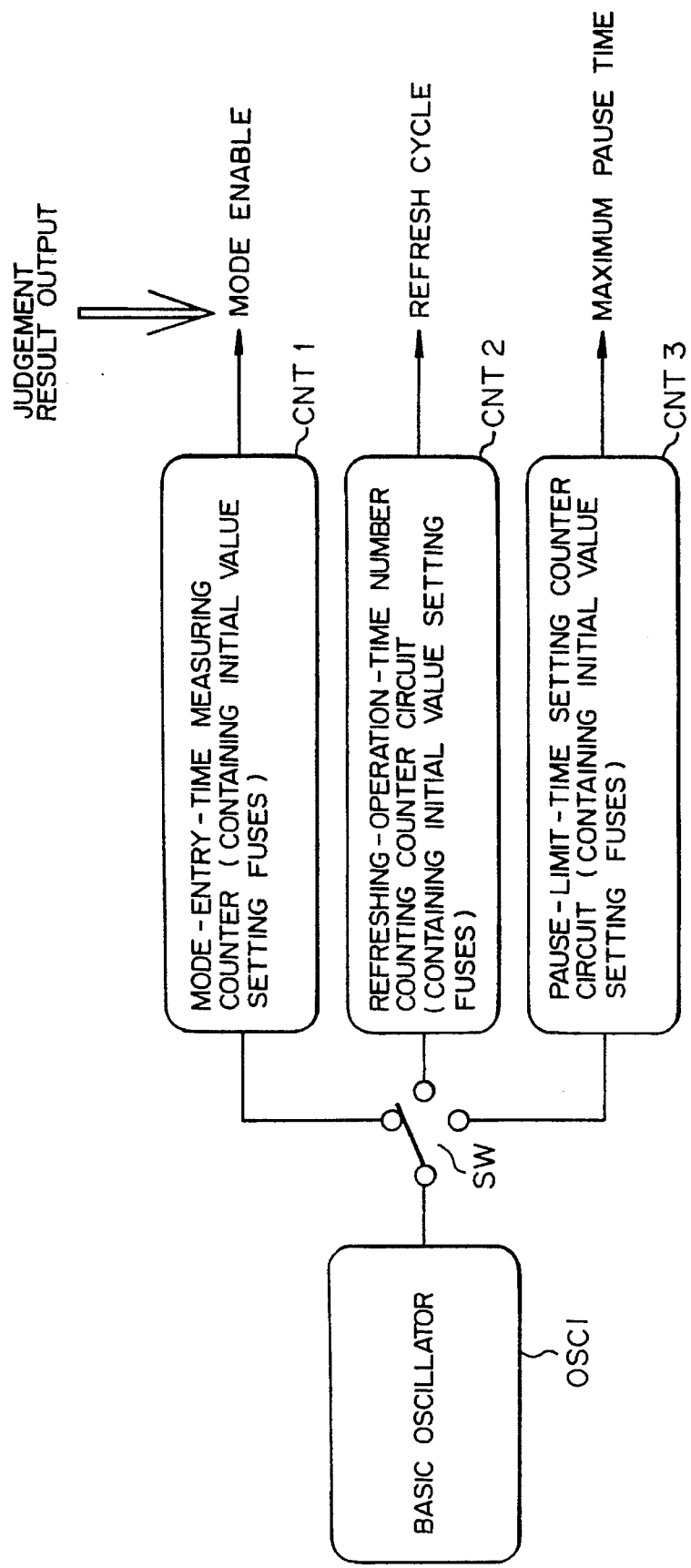
FIG. 1 is a schematic block diagram useful for describing a self-refreshing control circuit developed by the inventors prior to the present invention and, therefore, not publicly known.
Figure 2:
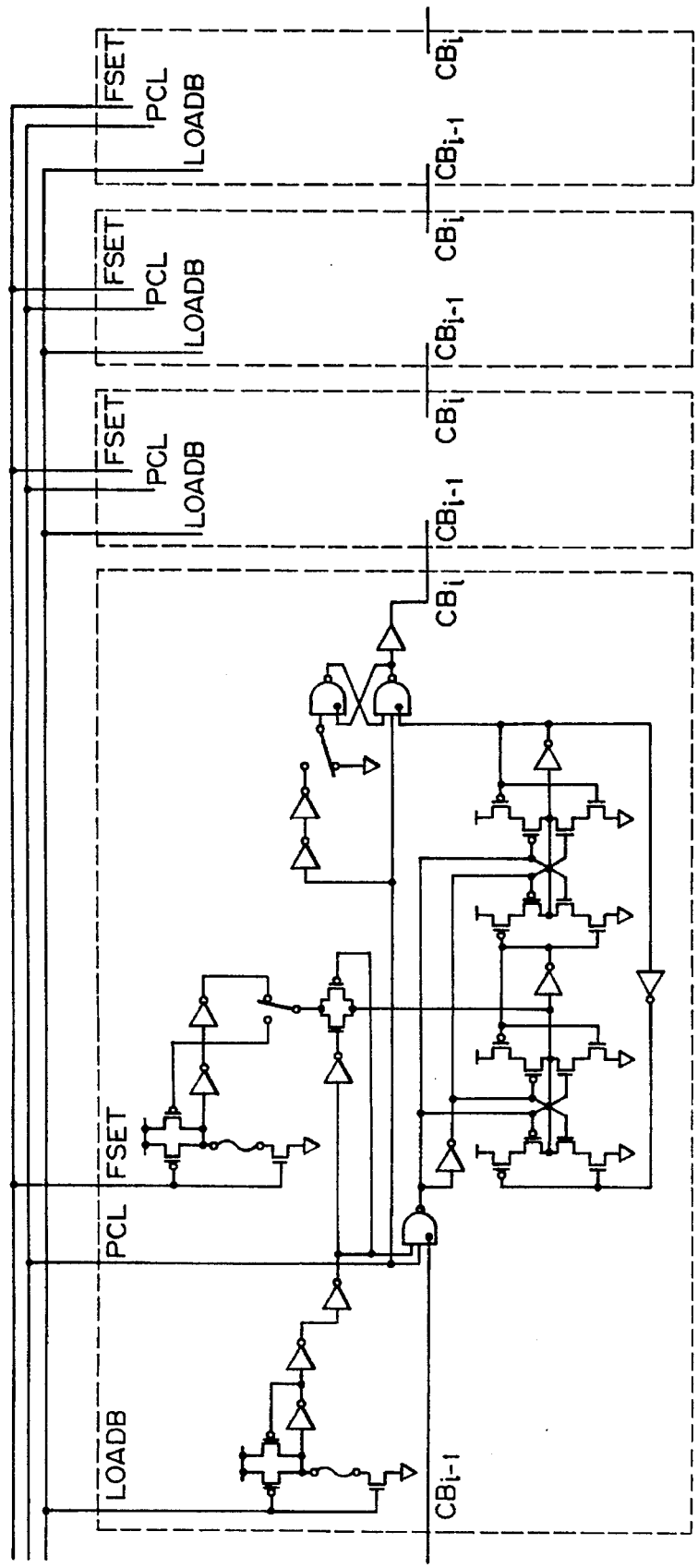
FIG. 2 is a circuit diagram of the counter circuit employed in the refreshing control circuit of FIG. 1.
Figure 3:
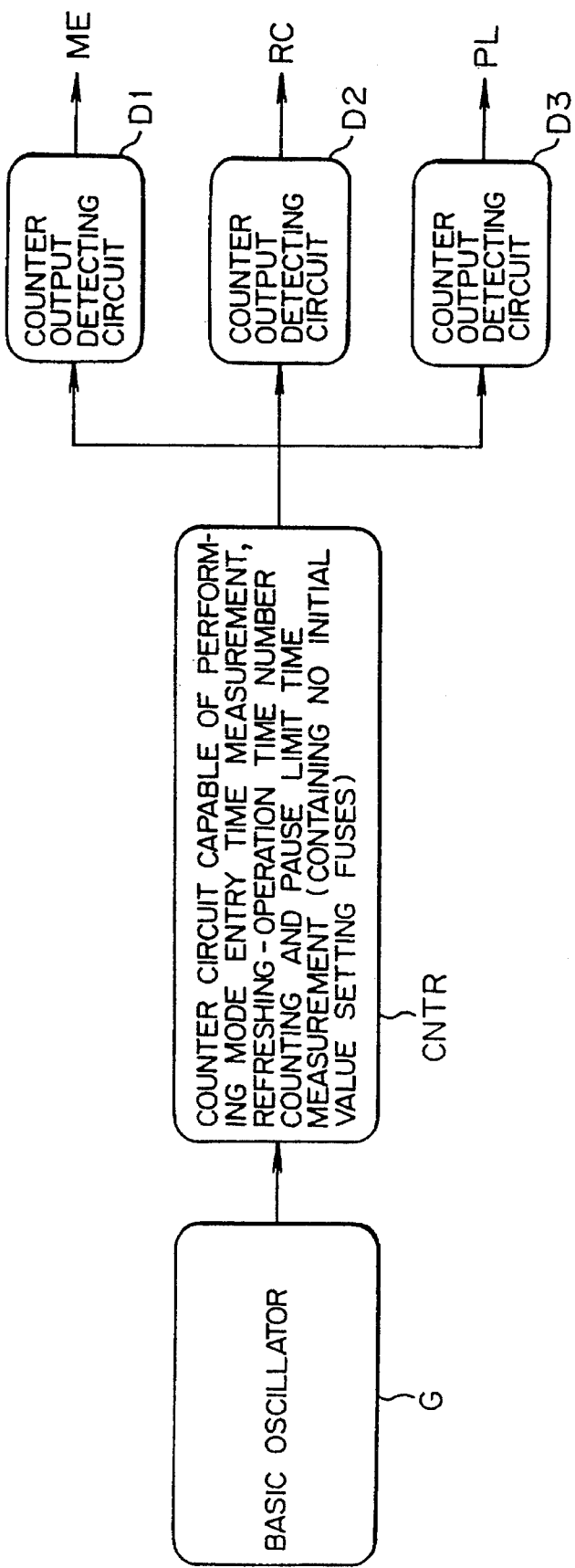
FIG. 3 is a schematic block diagram of a self-refreshing control circuit according to an embodiment of the present invention.

FIG. 3 is a schematic block diagram of a self-refreshing control circuit according to an embodiment of the present invention, The respective circuit blocks shown in FIG. 3 are fabricated on a single semiconductor substrate such as a single crystal silicon together with other circuit blocks for constituting a DRAM (dynamic random access memory) by way of the known semiconductor integrated circuit manufacturing technique.

A basic oscillator G is constructed of, for example, a ring oscillator (which will be described later) for producing a basic oscillation pulse signal. This oscillation pulse signal is supplied to a counter circuit CNTR. This counter circuit CNTR is made of, for example, a binary counter circuit counting pulses in the above-described oscillation pulse signal. This counter circuit serves as a multi-purpose counter having three functions, i.e., a mode entry time measurement function, a number of times of refreshing operation measurement function, and a pause limit time measurement function.

The measurement of the number of times of refreshing operation is to measure a maximum cycle number of the refreshing operation, namely, to measure the number of times of refreshing operations by which a single or one refreshing operation has been carried out for all memory cells. The counter circuit CNTR has a pause time counting bit in addition to a bit for measuring the above-mentioned number of times of refreshing operation. For instance, for approximately 4K (4096) refreshing cycles (number of times of word line driving for the refreshing), this counter circuit is constructed of a 19-bit binary counter circuit in which 12 bits are allocated to measure the number of times of refreshing operations and 7 bits are allocated to measure the pause time.

The counter circuit CNTR (containing no initial value setting fuse) produces, for example, three counting outputs, which are supplied to three counter output detecting circuits D1 to D3, respectively. The circuits D1 to D3 generate an output ME of the above-explained mode entry time measurement, an output RC of the number of times of refreshing operation measurement, and an output PL of the pause limit time measurement, respectively. These measurement outputs ME, RC, PL are appropriately selected by a control circuit described later and then outputted. The respective counter output detecting circuits contain initial value setting fuses therein. As a result, these constructions cope with various specifications of DRAMs on which this self-refreshing control circuit is included, and also time-axis fluctuation of the oscillation pulses from the basic oscillator caused by the manufacturing process.

It should be noted that if the refreshing cycle number of the DRAM is constant, namely when there is no need to select one refreshing cycle from three (or plural) refreshing cycles such as 1K refreshing cycle, 2K refreshing cycle, and 3K refreshing cycle, then the counter output detecting circuit for measuring the number of times of refreshing operation may omit the employment of the fuse circuit, and may be arranged by such a simple circuit capable of simply outputting an overflow signal of the counter circuit CNTR.

Figure 4:
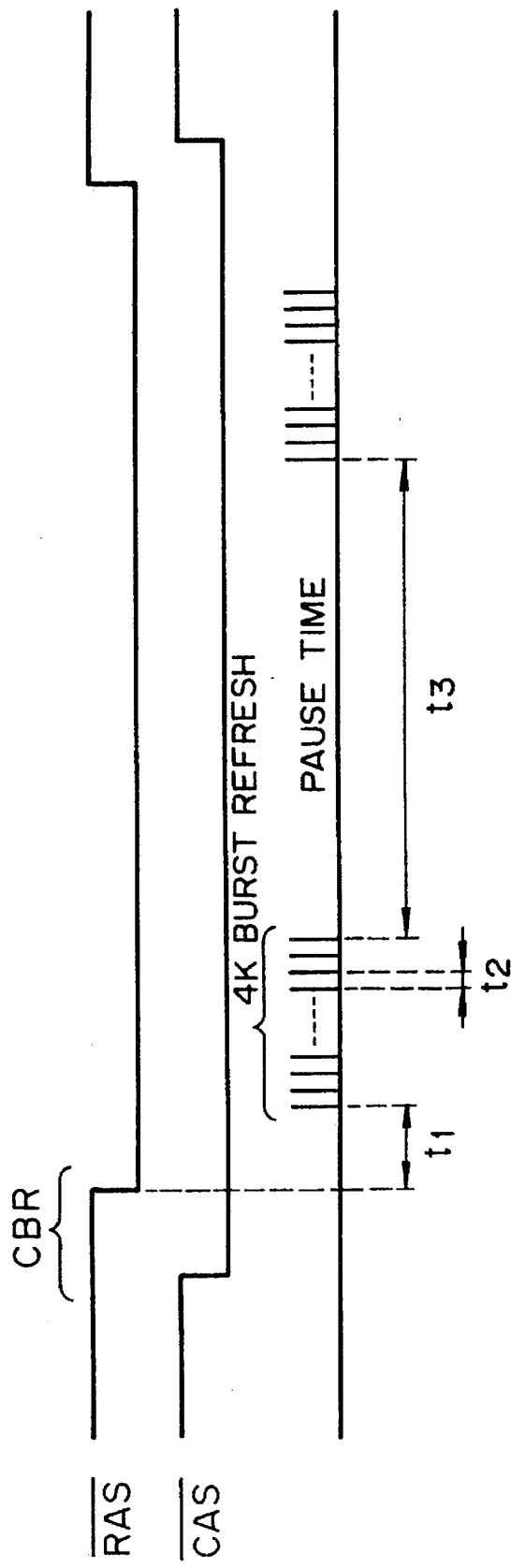
FIG. 4 is a timing chart for explaining a self-refreshing operation mode according to an embodiment of the present invention.

FIG. 4 is a timing chart for explaining the self-refreshing operation mode according to an embodiment of the present invention. A CBR (CAS before RAS refreshing) mode may be recognized by checking a falling edge of a row address strobe signal RAS (hereafter, simply referred to as a RASB signal) such that before the RASB signal is set to (changed to be at) a low level, a column-address strobe signal $\overline{CAS}$ (hereafter, simply referred to as a CASB signal) is set to (changed to be at) a low level in advance.

When a CBR refreshing operation mode is entered, a refreshing operation is carried out under such a condition that the CASB signal is maintained at a low level with the RASB signal being used as a clock signal. In other words, a counter circuit for producing a refreshing address signal (which is, for example, contained in an X-address buffer) counts internal signals generated from the RASB signal to produce a row-internal address signal necessary for the refreshing operation. When the low level of the RASB signal is kept longer than a mode setting time period "t1", this condition is judged as an entry to a self-refreshing operation mode.

In the self-refreshing operation mode, a burst refreshing operation constructed of 4K (4,096) cycles is performed at a time period "t2" of oscillation pulses in the pulse signal produced by the above-described basic oscillator G.

When such a burst refreshing operation is completed such that a single refreshing operation is carried out for all of memory cells by the above-described self-refreshing operation, the operation enters a pause time "t3". It is set in such a manner that a time period defined by an addition of this pause time t3 and the above-explained burst refreshing time (t2×4096) is not longer than information holding or retention time $t_{REF}$ of the memory cell ($t_{REF} \geq t2 \times 4096 + t3$). As a consequence, such a refreshing operation is repeatedly performed that before the information stored in a memory cell is lost, this information is read and amplified, and then the amplified information is rewritten into the original memory cell, so that the information stored in the dynamic type memory can be held.

Figure 5:
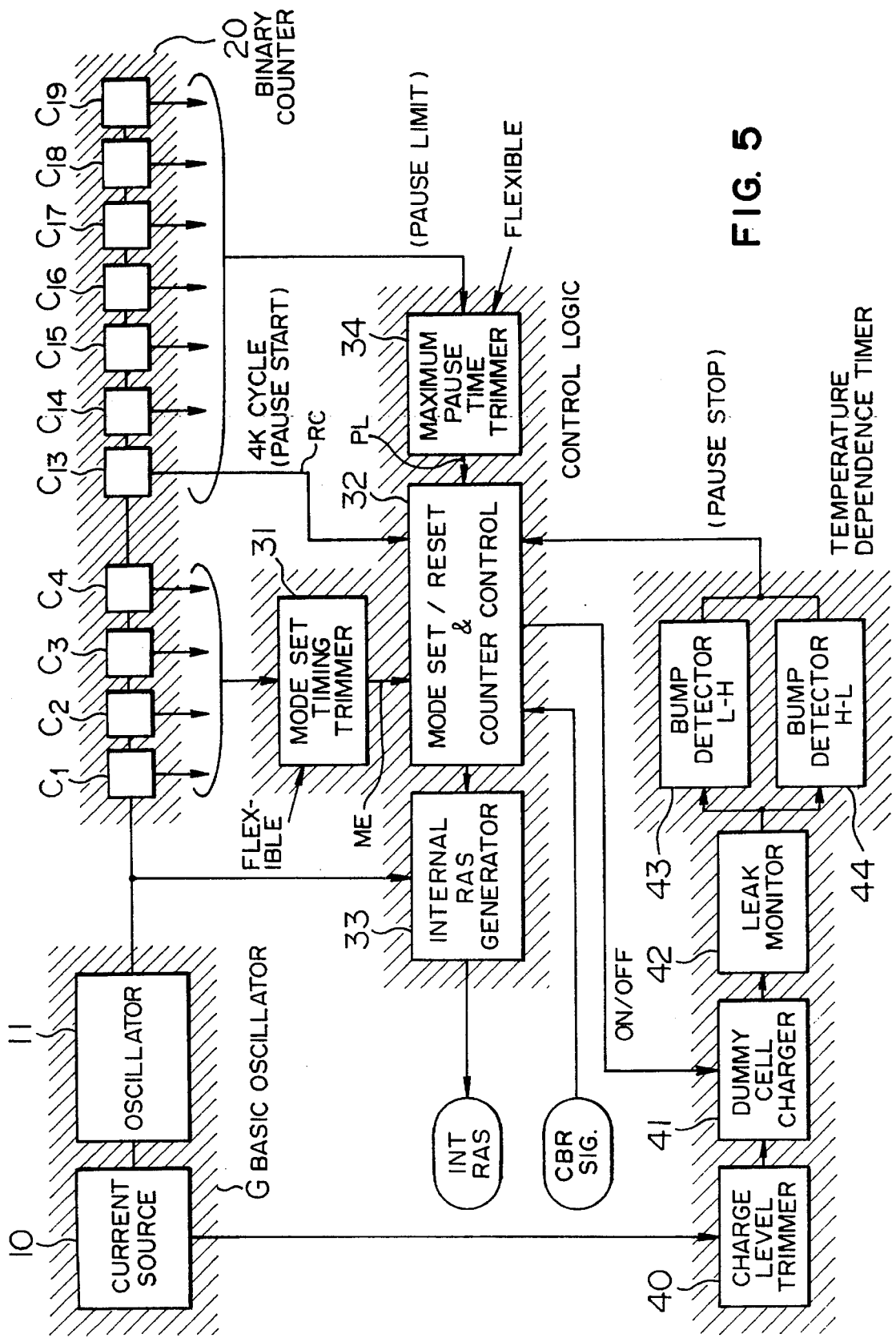
FIG. 5 is a schematic block diagram of a self-refreshing control circuit according to an embodiment of the present invention.

FIG. 5 is a schematic block diagram of a detail of a self-refreshing control circuit according to an embodiment of the present invention. A basic oscillator G includes a ring oscillator 11 made of CMOS inverter circuits whose operation current is controlled in response to a very low current produced by, for example, a current source 10 (which will be described later) in order to realize low power consumption and simplify the circuit arrangement.

The output signal (oscillation pulses) of the basic oscillator G is, on one hand, supplied to a binary counter circuit 20 constructed of 19 bits C1 to C19. The 4-bit counting outputs of C1 to C4 are supplied to a mode set timing trimmer 31 including programmable elements constructed of fuse means or the like. Here, it is so set that the counting value of the oscillation pulses is equal to a mode setting time (t1) longer than approximately 100 microseconds. That is, a correction to absorb variations of the period of the oscillation pulse signal due to the manufacturing process is carried out based upon the above counting value constructed of 4 bits. The output signal ME of this mode set timing trimmer 31 is supplied to a mode set/reset & counter control 32. In a normal operation mode (namely, a normal read/write operation mode other than the CBR refreshing operation mode), the counter circuit 20 is fixed to a forced reset state. The mode set/reset & counter control 32 causes the counter circuit 20 to be released from the reset condition, so that a mode entry time measuring operation is entered in response to a CBR detecting signal.

The oscillation pulse signal generated by the basic oscillator G is, on the other hand, supplied to an internal RAS generator 33. In this RAS generator 33, an INTRAS signal is generated which is necessary for carrying out the refreshing operation in the self-refreshing mode. Instead of the clock signal produced from the RASB signal during the above-explained CBR refreshing operation mode, this INTRAS signal is inputted into the refreshing address counter circuit (which is not shown and may be provided in the X-address buffer shown in FIG. 15). Since the first bit C1 to the 12th bit C12 of the counter circuit 20 count the same oscillation pulses as those of the refreshing address counter, this counter circuit can count or measure one cycle operation of the refreshing address counter circuit, namely, can measure or detect that the refreshing operation is completed once for all of memory cells.

The output RC from the 13th bit C13 of the counter circuit 20 is inputted as a pause start signal (corresponding to signal PSTART shown in FIG. 10A) to the mode set/reset & counter control 32. When the mode set timing trimmer 31 judges the self-refreshing mode, namely, when the CBR state continuing for a time period t1 is detected and an output signal ME is generated, the mode set-reset & counter control 32, responsive to the signal ME, resets the counter circuit 20 and then the operation condition is entered into the burst refreshing operation mode. (For simplicity sake, signal supply for the resetting of circuit 20 is not shown.) When 4096 burst refreshing operations have been accomplished, a carry signal is outputted from C12 of the counter circuit 20, thereby changing the binary level of the output of C13. As a result, the signal generated from 13th bit of the counter circuit 20, that is, a detection signal RC indicating that refreshing of all memory cells is completed is supplied to the mode set/reset & counter control 32, and a pause time measuring operation is commenced in connection with the completion of the burst refreshing operation.

The counting bits C13 to C19 of the counter circuit 20 are used to measure the pause time, and their outputs are supplied to a maximum pause time trimmer 34. It is so controlled in this case that the counting values C13 to C19 of the oscillation pulses are equal to time "$t_3$" having a relationship with $t_{REF} \geq$ refreshing period=$t_2 \times 4096 + t_3$. The maximum pause time trimmer 34 generates a detection signal PL upon detection of a lapse of time corresponding to the refreshing period.

Although not limited to the below-mentioned condition, a very low current of a current source 10 provided in the basic oscillator G is supplied to a charge level trimmer 40 for setting a voltage to which a dummy cell should be charged in which a charge voltage level control is carried out, and controlled low current is supplied to a dummy cell charger 41. The dummy cell charger 41 charges the dummy cell when the self-refreshing operation is commenced in response to the charge control signal from the mode set/reset & counter control 32 When the charge signal is "on" charging is effected, and when the charge signal is "off" the dummy cell is placed in a floating state so that charge leakage from the dummy cell is monitored. Both an output of a leak monitor 42 (produced when the dummy cell charge voltage is decreased to lower than a predetermined voltage) and outputs of bump detectors (L-H) 43 and (H-L) 44 for detecting variations (rising and falling changes) in the power supply voltages are used to produce a pause stop signal which will then be supplied to the mode set/reset & counter control 32. As a result, the pause time is forcibly ended, and the counter circuit 20 is reset (signal supply for the resetting being not shown in FIG. 5 for simplicity sake), so that the operation mode is entered into the burst refreshing mode.

When the mode set/reset & counter control 32 detects resetting of the RAS signal to a high level after the CBR detection signal, the self-refreshing operation mode is ended and the dynamic type RAM is returned to a standby state.

Figure 6:
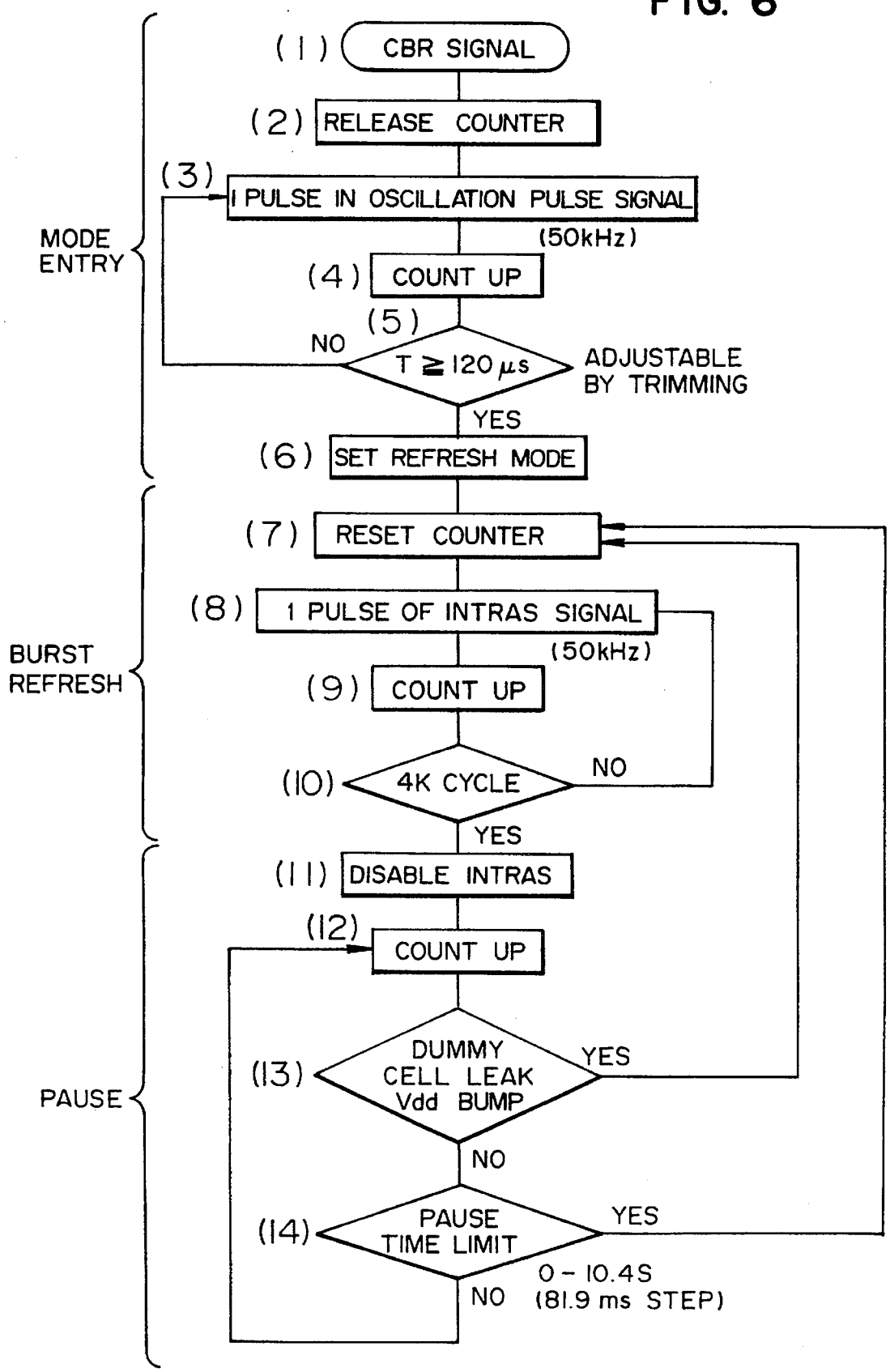
FIG. 6 is a flow chart for explaining an operation of the self-refreshing control circuit according to an embodiment of the present invention.

In FIG. 6, there is shown a flow chart for explaining operations of the self-refreshing control circuit according to an embodiment of the present invention.

Upon supply of the CBR signal to the mode set/reset & counter control 32 at step (1), the self-refreshing control circuit is initiated. The counter circuit 20 is released at step (2). In other words, although the counter circuit 20 is forcibly brought into a reset state, this reset state is released in response to the CBR signal, so that this counter may start its counting operation.

A judgement as to a mode entry is carried out by way of a loop defined from step (3) to step (5). That is, at step (3), one pulse is supplied from the basic oscillator G to the counter circuit 20, and this counter circuit counts up by one at step (4). This counting operation is carried out until this counting output becomes greater than a counting value corresponding to, for instance, 120 microseconds. When the RASB signal is broght into the high level during this loop, the process operation is out of this flow operation. In other words, the process operation goes out of the self-refreshing mode to a CBR refreshing mode.

When the CBR state is maintained for a time period longer than 120 microseconds (and the mode set timing trimmer 31 generates a detection signal ME), a self-refreshing mode is set at step (6). At the next step (7), the counter circuit 20 is first reset. At step (8), an INTRAS signal corresponding to the oscillation pulses of the basic oscillator G is generated from the internal RAS signal generator 33, whereby a single or one refreshing operation is carried out. At step (9), the counter circuit 20 counts up by one in accordance with the refreshing operation.

At step (10), a check is done as to whether or not 4K (4096) refreshing operations have been completed. If the number of times of refreshing operations is smaller than 4K, then the process operation is returned to step (8) at which the refreshing operation is repeatedly performed. That is, a burst refreshing operation is carried out at a frequency of about 50 KHz of the basic oscillator.

When a judgement is made at the step (10) that the 4K refreshing operations have been completed (13th bit of the counter circuit 20 generates a detection signal RC), the INTRAS signal from the internal RAS signal generator 33 is disabled at step (11). As a consequence, the operation is entered into a pause time. At step (12), the counting operation of the counter circuit 20 still continues. At step (13), a check is made as to whether or not there are bumps on (i.e., fluctuations of) the power source voltage Vdd or leakage from the dummy cell. If there is neither leakage nor bumps, then another check is done about the counting output corresponding to the pause time at step (14). If the counting output does not reach a value for the pause time, then the process operation is returned to step (12) at which the count-up operation is repeatedly performed.

When the counting output reaches a value for the pause time (maximum pause time trimmer 34 generates a detection signal PL), the process operation is returned to step (7) at which the counter circuit 20 is reset. Thereafter, another burst refreshing operation is carried out in accordance with the loop defined from the steps (8) to (10).

At any one of the above-described steps, when the CBR condition is not satisfied, the refreshing mode is reset (or released), so that the operation mode enters into either a CBR refreshing mode or a standby mode. The counter circuit is forcibly brought into a reset state by the mode set/reset & counter control 32 responsive to the release of the above-mentioned self-refreshing mode. Signal supply for the resetting of the counter circuit is not shown in FIG. 5 for simplicity sake. (See reset signal CRST in FIG. 7)

Figure 7:
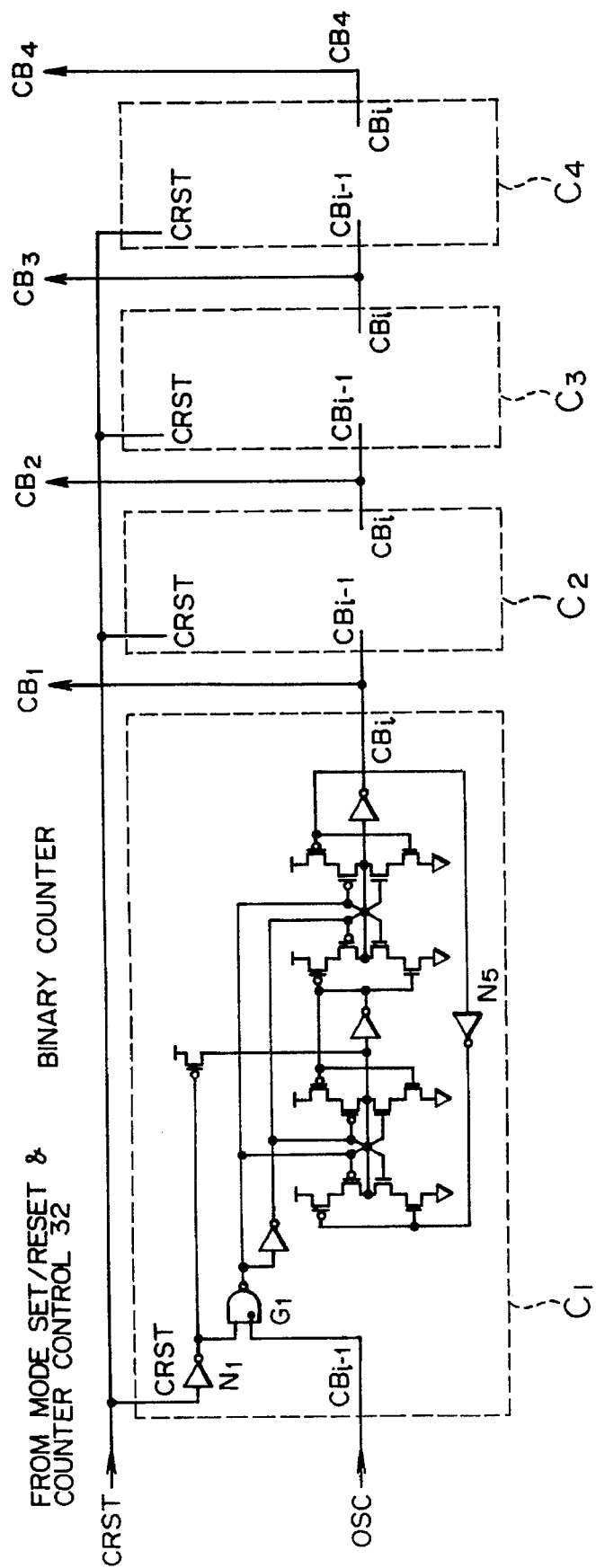
FIG. 7 is a partial circuit diagram of the counter circuit shown in FIG. 5.

FIG. 7 partially shows a circuit structure of the above-explained counter circuit 20 according to an embodiment of the invention. In this circuit diagram, circuits for four bits C1 to C4 are shown, with only a specific circuit structure of the first bit C1 being exemplarily illustrated. Illustration of circuit structures of the remaining bits C2 to C4 are omitted. That is, the circuit of FIG. 7 operates to detect a continuation of a CBR state for the self-refreshing operation mode setting time.

A signal CRST is a counter reset signal supplied from the mode set/reset & counter control 32. When this counter reset signal CRST is changed to be at a high level, the output signal of the inverter circuit N1 is changed to be at a low level so that a NAND gate G1 for receiving a pulse OSC produced from a pulse signal from the oscillator 11 is closed and a P-channel MOSFET is brought into an ON state, whereby an internal circuit is fixed to a high level.

An internal circuit includes a master/slave flip-flop circuit having two CMOS latch circuits, which performs a binary counting operation with the logic level of the bit C1 changed every time one oscillation pulse OSC is inputted when the reset signal CRST is at a low level.

Since the output of each bit is supplied as an input pulse to a similar post-stage circuit so that a carry signal is asynchronously and serially transferred from one bit to the next higher order bit. By use of binary counter circuit of the type described above, the entire circuit structure can be greatly simplified. That is, since the counter circuit itself of this embodiment does not produce a refreshing address signal by itself, there is no need to employ a synchronous counter circuit such as an address counter for producing the refreshing address signal. CB1 to CB4 in FIG. 7 represent output signals from bits C1 to C4.

Figure 8B:
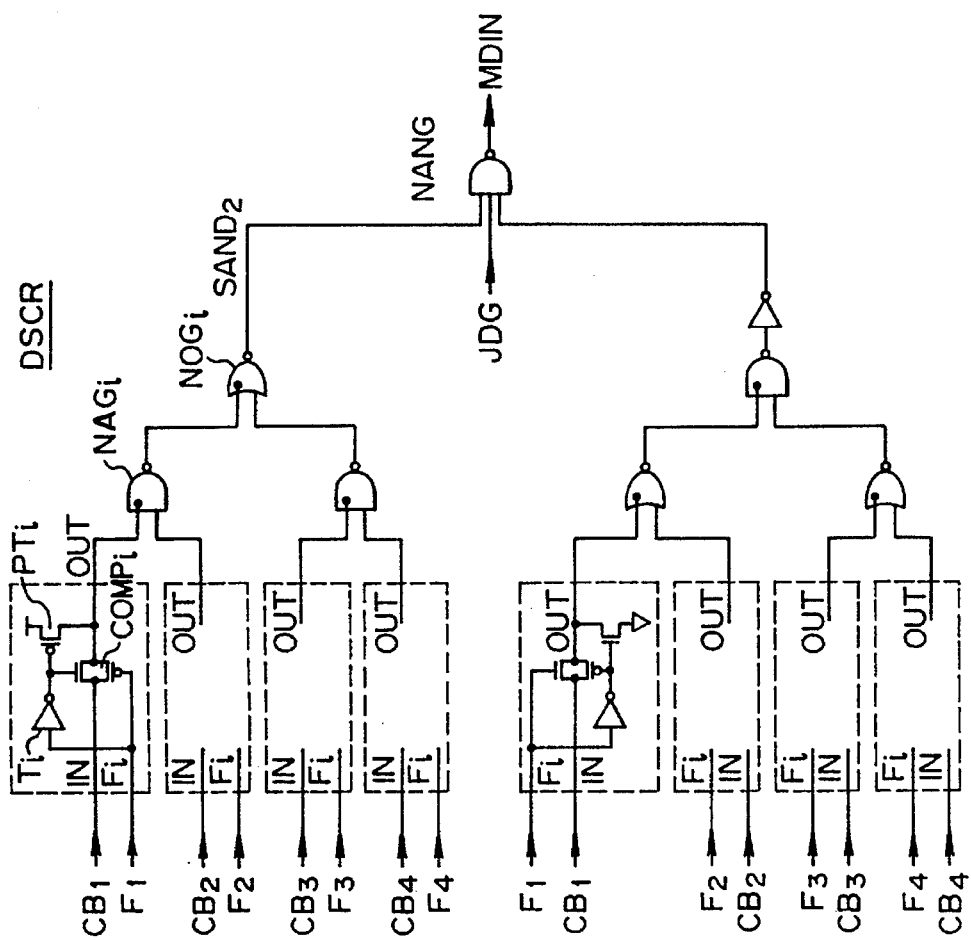
FIGS. 8A and 8B are circuit diagrams of the judgement value setting circuit and output judging circuit for the mode setting time of the self-refreshing operation, both circuits constituting a mode set timing trimmer in the control circuit of FIG. 5.
Figure 8A:
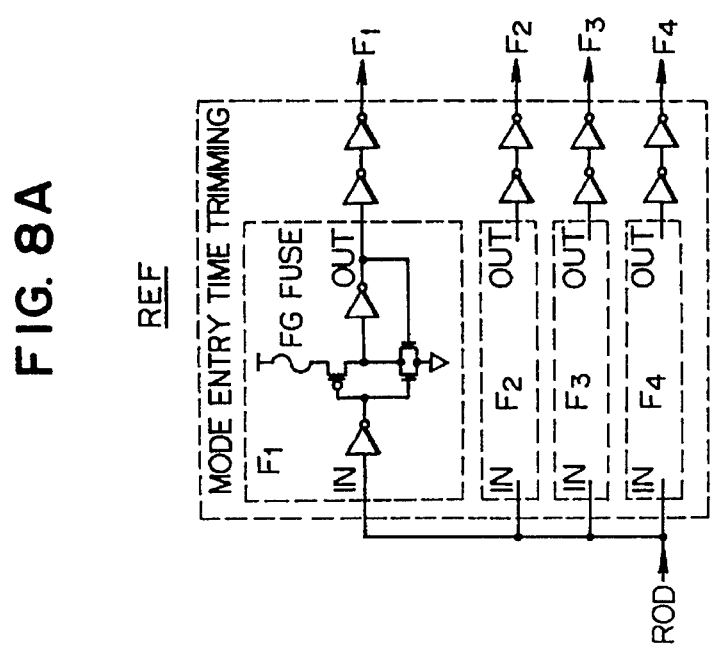

FIGS. 8A and 8B show circuit diagrams of a judgement value setting circuit REF and an output judging circuit DSCR for the mode setting time of the self-refreshing mode. These circuits REF and DSCR constitute the mode set timing trimmer 31. The judgement value setting circuit REF utilizes a fuse circuit in which first polysilicon layers are used as programmable elements. In other words, the above-described fuse means are selectively cut out by a high energy beam such as a laser radiation. Reading of fuse providing information is carried out in response to a signal ROD, so that signals F1 to F4 corresponding to whether or not the fuse means are cut out are produced.

The output judging circuit DSCR includes a CMOS transfer gate Ti controlled by the fuse signals Fi (F1 to F4), a comparing circuit "COMPi" for transferring the counter output CBi via this transfer gate Ti, and a three-staged logic circuit of a NAND gate circuit NAGi, a NOR gate circuit NOGi, and a NAND gate circuit NANG for receiving this comparison output. A pull-up, or pull-down MOSFET PTi is provided on the output side of the transfer gate Ti, and sets the output to either a high level or a low level when the transfer gate circuit Ti is brought into an OFF state.

For instance, when the fuse signal Fi is changed to be at a high level in the upper half circuit as viewed in FIG. 8B, the transfer gate Ti is closed thereby to forcibly set its output to the high level. To the contrary, when the fuse signal Fi is changed to be at a high level in the lower half circuit as viewed in FIG. 8B, the transfer gate is open whereby the counter output (inverted signal) CBi is outputted. In other words, when the fuse signal Fi is at a high level in the lower half circuit, a coincidence signal representative of the counter outputs CBi being at a low level (high level Ci) is produced.

Conversely, when the fuse signal Fi is changed to be at a low level, the transfer gate is closed in the lower half circuit, so that the counter output is forcibly set to a low level. To the contrary, when the fuse signal Fi is changed to be at a low level in the upper half circuit, the transfer gate is opened to output the counter output (inverted signal) CBi. In other words, when the fuse signal Fi is at a low level in the upper half circuit, a coincidence signal representative of the counter outputs CBi being at a high level (low level Ci) is produced.

When all of the comparison outputs are at the high level in the upper half circuit, and all of the comparison outputs are at the low level in the lower half circuit, the coincidence signals are formed and then a coincidence judging signal MDIN is produced via the final-staged NAND gate circuit NANG. A comparison judging signal JDG is supplied from the mode set/reset & counter control 32 to the final-stage NAND gate circuit NANG. The JDG signal supply is not shown in FIG. 5 for simplicity sake.

It takes a long time period until all of the outputs become stable due to skews of the counting outputs when the binary counter 20 of the type described above with reference to FIG. 7 is employed. To cope with this, the judging result is obtained by use of the judging signal JDG which is produced in a relatively delayed relation to the counting pulses. As a consequence, it is possible to prevent whisker-shaped noise from being superposed on detection signals ME and PL generated by the trimmers 31 and 32, respectively, which noise may be caused by the counting operation by the counter circuit.

Figure 11:
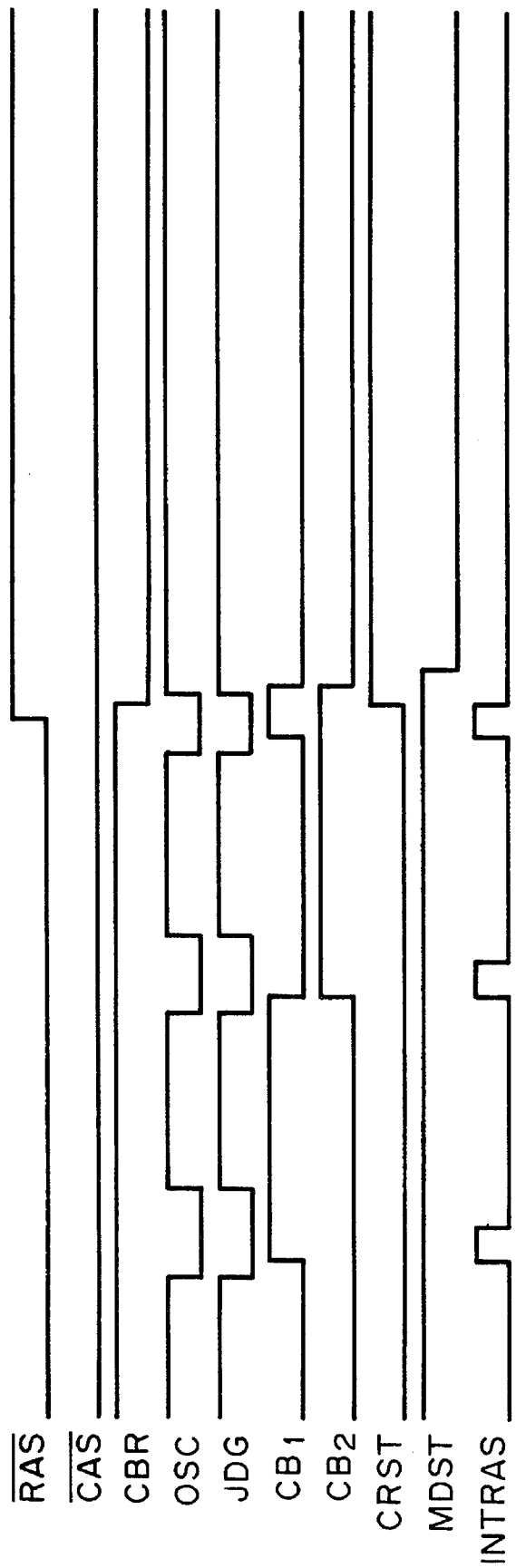
FIG. 11 is another timing chart for explaining the operations of the self-refreshing control circuit according to an embodiment of the present invention.

FIG. 9 to 11 are timing charts for explaining operations of the self-refreshing control circuit according to an embodiment of the present invention. FIG. 9 illustrates a judgement operation of the self-refreshing mode and a starting operation of the burst refreshing mode. After the CASB signal is set to a low level, when the RASB signal is set to a low level, a CBR signal is produced. As a result, the counter reset signal CRST (FIG. 7) is changed to be at a low level, so that the resetting state of the counter circuit is released.

In accordance with the high level of the CBR signal, both the pulse signal OSC produced from the output signal of the basic oscillator G and the judging signal JDG (FIG. 8B) which is relatively delayed at its falling edge from the oscillation signal OSC are produced. In order that the judging output is immediately obtained in response to the first counting output, the signal JDG is formed from the output signal of the basic oscillator G, and this signal JDG is delayed to produce the signal OSC. The counting operation of the counter circuit 20 is performed in synchronism with the falling edge of this signal OSC, and the judging operation for the counter counted output is performed during the high level of the signal JDG relatively delayed with respect to this signal OSC. Namely, judgement as to the mode setting for the self-refreshing mode is made.

Although not limited to the following example, the high levels of the counting signals CB1 and CB2 are determined with the high level of the signal JDG, so that judgement by the mode setting time of the self-refreshing mode is carried out. Based on this judgement result, the mode setting signal MDST is set to a high level, thereby setting the self-refreshing mode. Also, the counter reset signal CRST from the mode set/reset and counter control 32 is is changed to be at the high level to reset the counter circuit 20.

In synchronism with the oscillation pulse signal OSC, an internal RAS signal INTRAS is produced by the internal RAS signal generating circuit 33 (see FIG. 5) in accordance with the high level of the mode set signal MDST. In synchronism with this signal INTRAS, the refreshing operation is performed once. Subsequently, the refreshing operation is carried out in response to the signal INTRAS, hence the oscillation pulse signal OSC, so that the counting output signals CB1, CB2, —are changed in accordance with the counting operation by the counter circuit 20.

FIG. 10A exemplarily shows a timing chart for an operation change when a burst refreshing mode is ended and the operation mode enters a pause time. When the counting output CB12 of the counter circuit 20 is changed to be at the low level and the counting output CB13 thereof is changed to be at the high level (a detection signal RC is generated), it is judged that 4096 cycles of the burst refreshing operation are completed, and a pause start signal PSTART produced from the detection signal is set to a high level. As a result, the delivery of the INTRAS signal for the refreshing operation from the internal RAS signal generating circuit 33 is stopped. A pause time measurement is commenced in response to the counting outputs CB13 to CB19 of the counter circuit 20.

FIG. 10B exemplarily shows a timing chart for an operation change when the pause time is ended and the operation mode enters a burst refreshing mode. Among the counting outputs CB13 to CB19 from the counter circuit 20, when counting output CB18 is set to a low level and counting output CB19 is set to a high level in accordance with the initial-set counting output (other counting output signals being coincident with the initially set conditions), as exemplified in FIG. 10B, the pause start signal PSTART is reset to a low level and the counter reset signal CRST is set to a high level to thereby reset the counter circuit 20. In response to the low level of the pause start signal PSTART, the output signal INTRAS of the internal RAS signal generating circuit 33 is again generated, so that a burst refreshing operation similar to the previous refreshing operation is commenced.

FIG. 11 exemplarily shows a timing chart for an end of the self-refreshing mode. When the RASB signal is changed to be at a high level during the above-explained burst refreshing operation, the level of the CBR signal is changed to be at a low level to stop the self-refreshing operation. In other words, the counter reset signal CRST is changed to be at a high level in response to the signal RASB, so that the counter circuit 20 is forcibly brought into the reset state.

In accordance with the high level of the signal CRST, the counting outputs CB1, CB2 and the like of the counter circuit 20 are set to a low level, and the mode set signal MDST supplied from the mode set/reset and counter control 32 to the internal RAS signal generating circuit 33 is reset to a low level because of the low level of the CBR signal. The pulse signal OSC and the judging signal JDG are fixed to a high level by the gate circuits controlled by the mode setting signal and so on.

Figure 13:
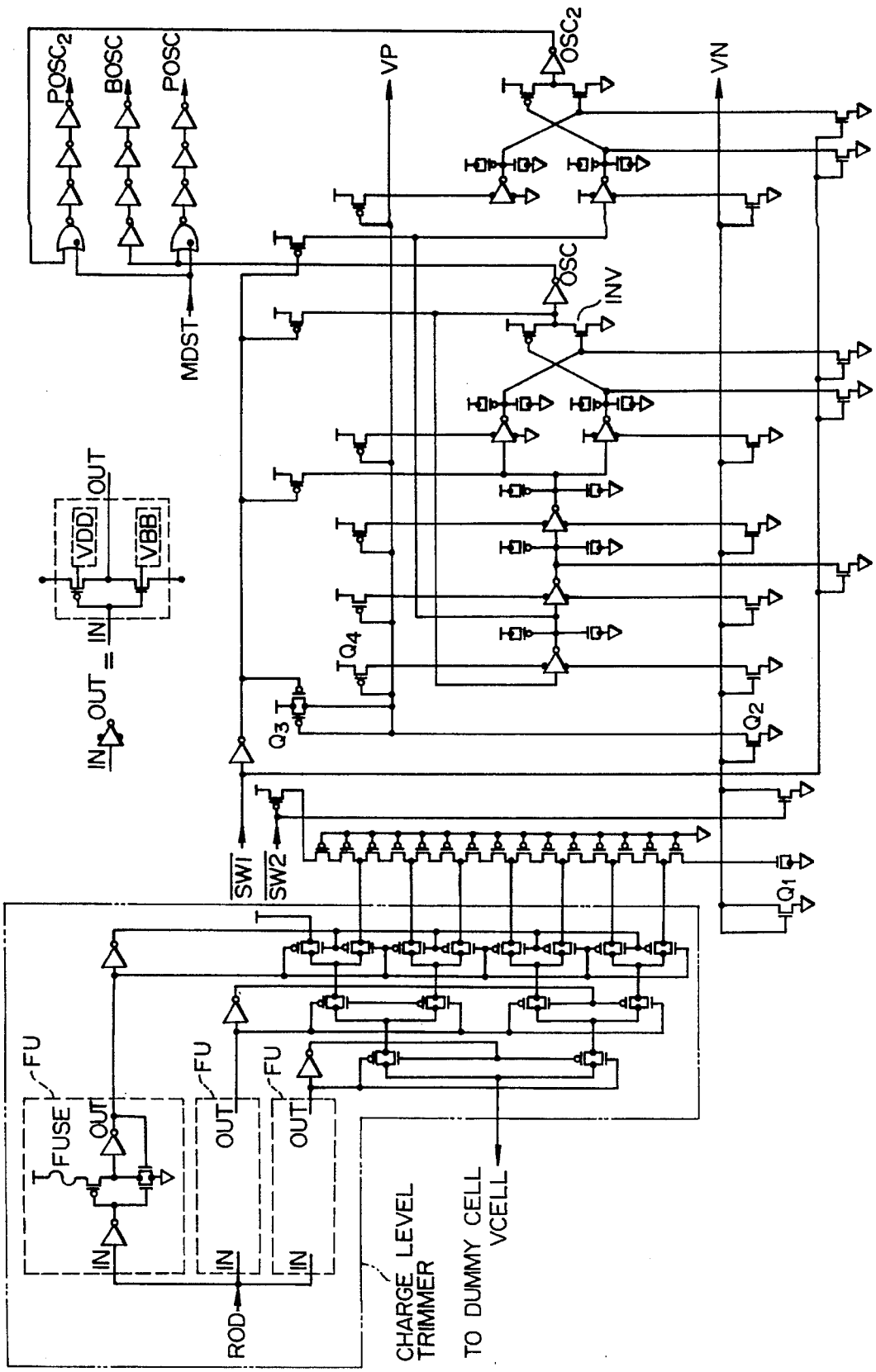
FIG. 13 is a circuit diagram indicating an example of a structure of the basic oscillator and the current source shown in FIG. 5 which may be used in an embodiment of the present invention.

FIG. 13 is a circuit diagram of the basic oscillator of FIG. 5 according to an embodiment. In this figure it is to be noted that a P channel MOSFET is distinguishable from an N channel MOSFET by marking a circle at a gate thereof. In this embodiment, to produce such an oscillation pulse having a relatively low frequency (approximately 50 KHz) by way of employing a small number of CMOS inverter circuits under low power consumption, the following current source circuit 10 is provided.

A very low current is generated by a series-connected P channel MOSFETs. This very low current is caused to flow through an N channel MOSFET Q1 in diode connection, and is supplied via a transistor Q2 arranged in a current mirror form with this transistor Q1 to a P channel MOSFET Q3 in diode connection.

An operation current of the CMOS inverter circuit on the ground potential side is controlled by the N channel MOSFET Q2 arranged in a current mirror form together with the above-described N channel MOSFET Q1. An operation current of the CMOS inverter circuit on the power source potential side is controlled by a P channel MOSFET arranged in a current mirror form together with the P channel MOSFET Q3.

The CMOS inverter circuit is arranged such that only a very low current flows therein, as described above, and the output signal of the inverter circuit is varied with a relatively large time constant owing to an MOS capacitance formed by a P channel MOSFET on the power source potential side for output, and an MOS capacitance formed by an N channel MOSFET on the ground potential side of the inverter circuit. In other words, the signal delay time per one stage CMOS inverter circuit is set to be relatively long by the above-described current limit and delaying capacitances.

Three CMOS inverter circuits of the type as described above are connected in cascade. The fourth CMOS inverter circuit stage includes two CMOS inverter circuits having limited currents on the power supply potential side only and the circuit ground potential side only, respectively, so that the fourth stage gives an output having a delay and a sufficient level to the level converting CMOS inverter circuit INV. Meanwhile, the output signal of the level converting CMOS inverter circuit is fed back to the first-stage CMOS inverter circuit. The output signal of the circuit INV is further outputted as oscillation pulses OSC via an output CMOS inverter circuit.

Although not limited to the following case, the basic oscillator of this embodiment is used not only in the above-explained self-refreshing operation, but also may be used in common as a substrate back-bias voltage generating circuit other than the above-explained self-refreshing operation, and a circuit for generating oscillation pulses to be inputted to a charge pump circuit for producing a boosted voltage necessary for the internal word line selection or for an output circuit.

Therefore, a NOR gate circuit controlled by the mode set signal MDST supplied from the mode set/reset and counter control 32 is provided at the output circuit, so that an oscillation pulse signal POSC used other than the self-refreshing operation is outputted. On the other hand, an oscillation pulse BOSC (corresponding to the output of the basic oscillator G shown in FIG. 5) which is normally outputted via an inverter circuit is formed and is supplied to, for instance, the substrate back-bias voltage generating circuit.

Although not limited to the below-mentioned case, in order to make a phase difference of π/2 between the pulse signal POSC and an oscillation pulse signal POSC2 which is used to generate a boosted voltage, and the pulse signal POSC2 is outputted through three stages, the first stage including two CMOS inverter circuits which have limited currents on the source voltage side and the ground potential side, respectively, similar to the above-described case, the second stage including a level converting CMOS inverter circuit driven by the first stage CMOS inverter circuits, and the third stage including an output inverter circuit. The outputs POSC2, BOSC and POSC are, similarly to the above-mentioned case, selectively outputted through the NOR gate circuits controlled by the mode set signal MDST.

Although not limited to the following condition, the divided voltages produced by the series connection of the P channel MOSFETs are selectively outputted by a switch tree of CMOS transfer gates to produce a charge voltage for a dummy cell. In other words, a voltage to charge up the dummy cell is determined in a programmable manner by the fuse circuits FU in accordance with the effective information holding time of the memory cells of the dynamic type RAM. For instance, with respect to DRAMs with a relatively long information holding time, the charge-up voltage of the dummy cell is set to a high voltage, whereas with regard to DRAMs with a relatively short information holding time, the charge-up voltage of the dummy cell is set to a low voltage. In this embodiment, a selection is made of one charge-up voltage from eight different charge-up voltages including the power supply voltage in response to a signal formed by the three fuse circuits.

Figure 12:
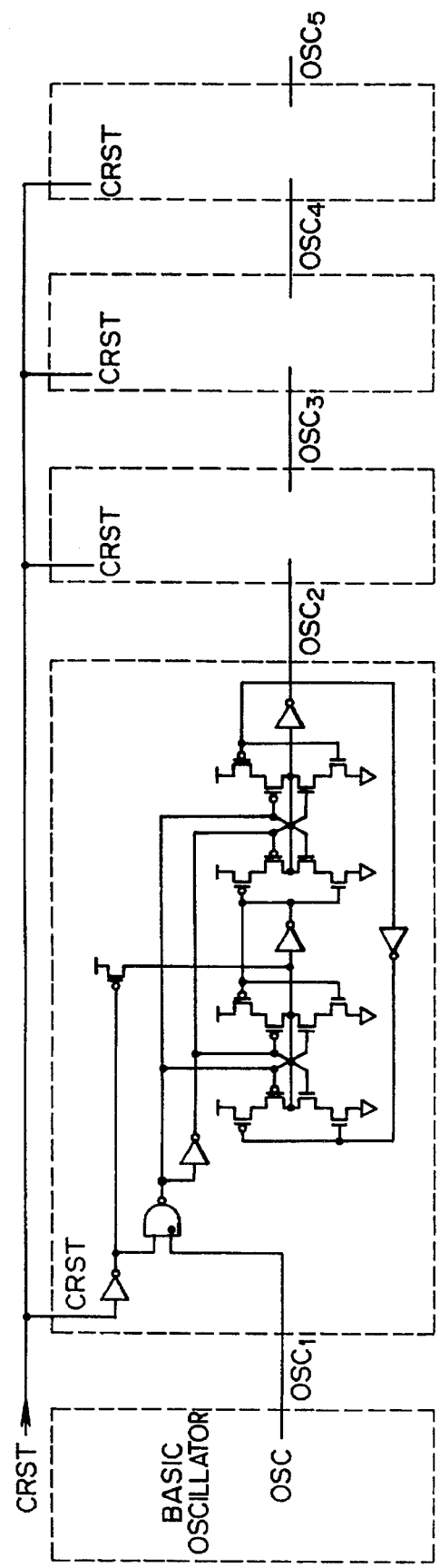
FIG. 12 is a circuit diagram indicating an example of a structure of a basic oscillator which may be used in an embodiment of the present invention.

FIG. 12 shows another circuit diagram of the basic oscillator according to another embodiment. In this embodiment, the basic oscillator includes an oscillating circuit and a frequency dividing circuit. As the frequency dividing circuit, a binary counter circuit similar to the above-described counter circuit may be employed. When the counter reset signal CRST is properly generated from such a counter output detecting circuit having a fuse circuit and a logic circuit, a variable frequency dividing operation may be performed. In this manner, the period of 4096 refreshing operations could be smaller than, or equal to $t_{REF}$. In other words, the interval $t_2$ of the refreshing time duration may be adjusted by the fuse circuit to omit the pause time $t_3$. In this circuit arrangement, since the counter circuits are only required to have outputs CB1 to CB13, namely 13 bits, the entire circuit may be simplified.

Figure 14:
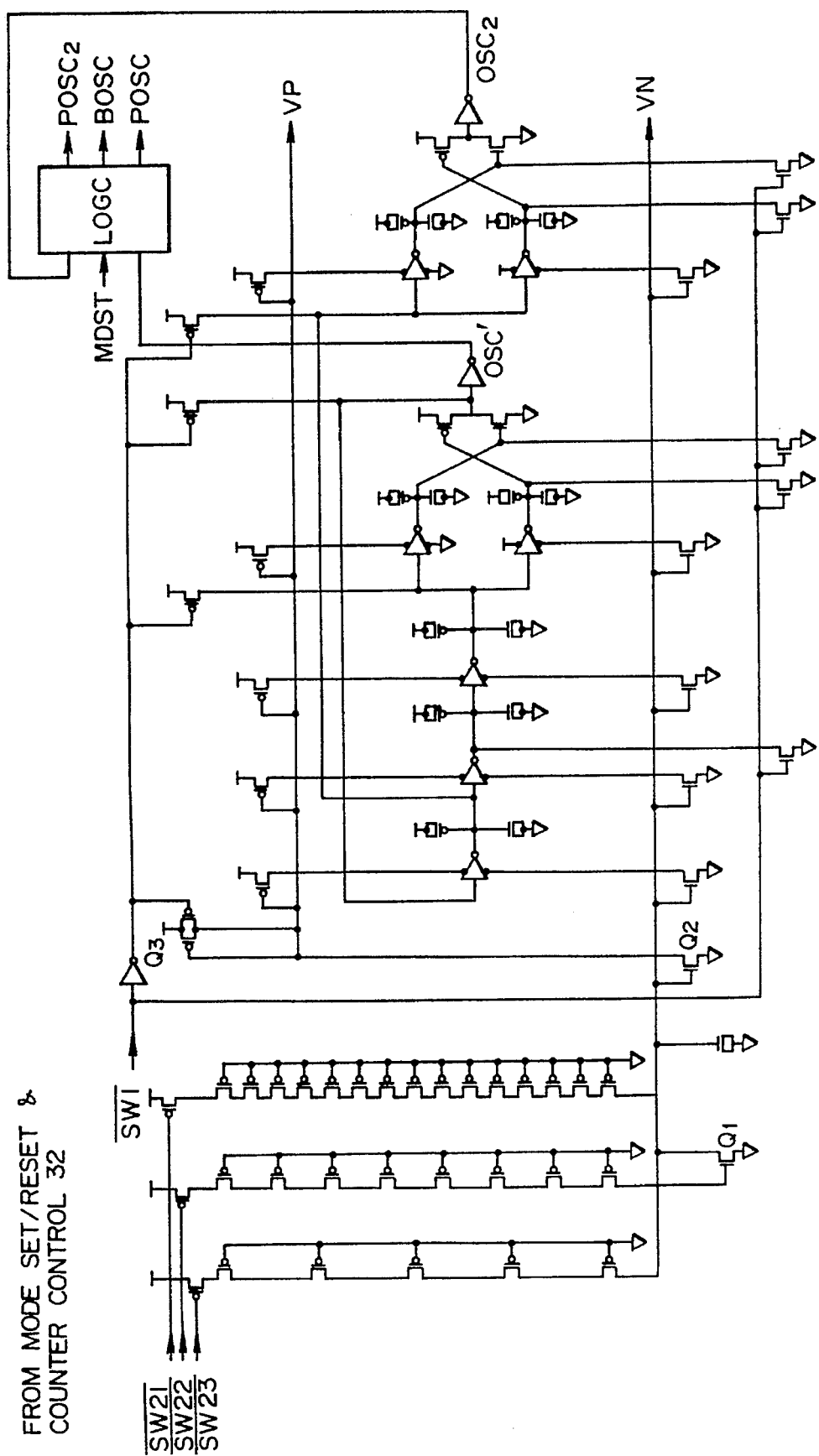
FIG. 14 is a circuit diagram indicating an example of a structure of the basic oscillator and the current source of FIG. 5 which may be used in an embodiment of the present invention.

FIG. 14 shows a circuit diagram of the basic oscillator according to a further embodiment. Since the basic circuit portion of the oscillating circuit is the same as that of FIG. 13, no further explanation thereof will be made with reference to FIG. 14. In this embodiment, the repetition frequency of the oscillation pulses is changeable. That is, a current source includes three sections, i.e., fifteen P channel MOSFETs series-connected to each other, eight P channel MOSFETs series-connected to each other, and five P channel MOSFETs series-connected to each other. Thus, the repetition frequency of the oscillation pulse is selectable by setting one of the P channel MOSFETs switch-controlled by selection signals $\overline{SW21}$, $\overline{SW22}$ and $\overline{SW23}$.

When the signal $\overline{SW21}$ is set to a low level, since an operation voltage is applied to the above-explained fifteen series-connected P channel MOSFETs and a corresponding low current of a relatively small amplitude flows through the CMOS inverter circuits constituting the ring oscillator, an oscillation pulse signal OSC' having a low frequency is obtained.

When the selection signal $\overline{SW22}$ is set to a low level, an operation voltage is applied to the eight series-connected P channel MOSFETs, and a corresponding low current of an intermediate amplitude flows through the CMOS inverter circuits constituting the ring oscillator, so that an oscillation pulse signal OSC' having an intermediate frequency is obtained.

When the selection signal $\overline{SW23}$ is set to a low level, since an operation voltage is applied to the above described five series-connected P channel MOSFETs, and a corresponding low current of a relatively large amplitude flows through the CMOS inverter circuits constructing the ring oscillator, the oscillation pulse signal OSC' having a high frequency is obtained.

The above-described change-over of the frequency may be made, for instance, by setting the frequency to a low value during the pause time measurement which may take a relatively long measuring time, by setting the frequency to a high value during the mode set measurement which may take a relatively short measuring time, and by setting the frequency to either a low value or an intermediate value during the burst refreshing mode.

Since the frequency of the oscillation pulses is selectable as described above, even when a total bit number of the counter circuit would be selected to be a smaller bit number than 19 bits, the above-described pause time measurement could be similarly performed. In case of measuring of a shorter mode setting time, more precise setting time may be achieved by employing the oscillation pulses having a higher frequency.

The above-explained frequency changing operation may be employed in order to omit the pause time similar to that of the previous embodiment shown in FIG. 12. In other words, the frequency of the oscillation pulse may be set to a high value during the mode setting operation, and the frequency of the oscillation pulse may be sufficiently lowered when the operation mode enters the self-refreshing mode, whereby 4096 cycles are less than the time $t_{REF}$.

Figure 15:
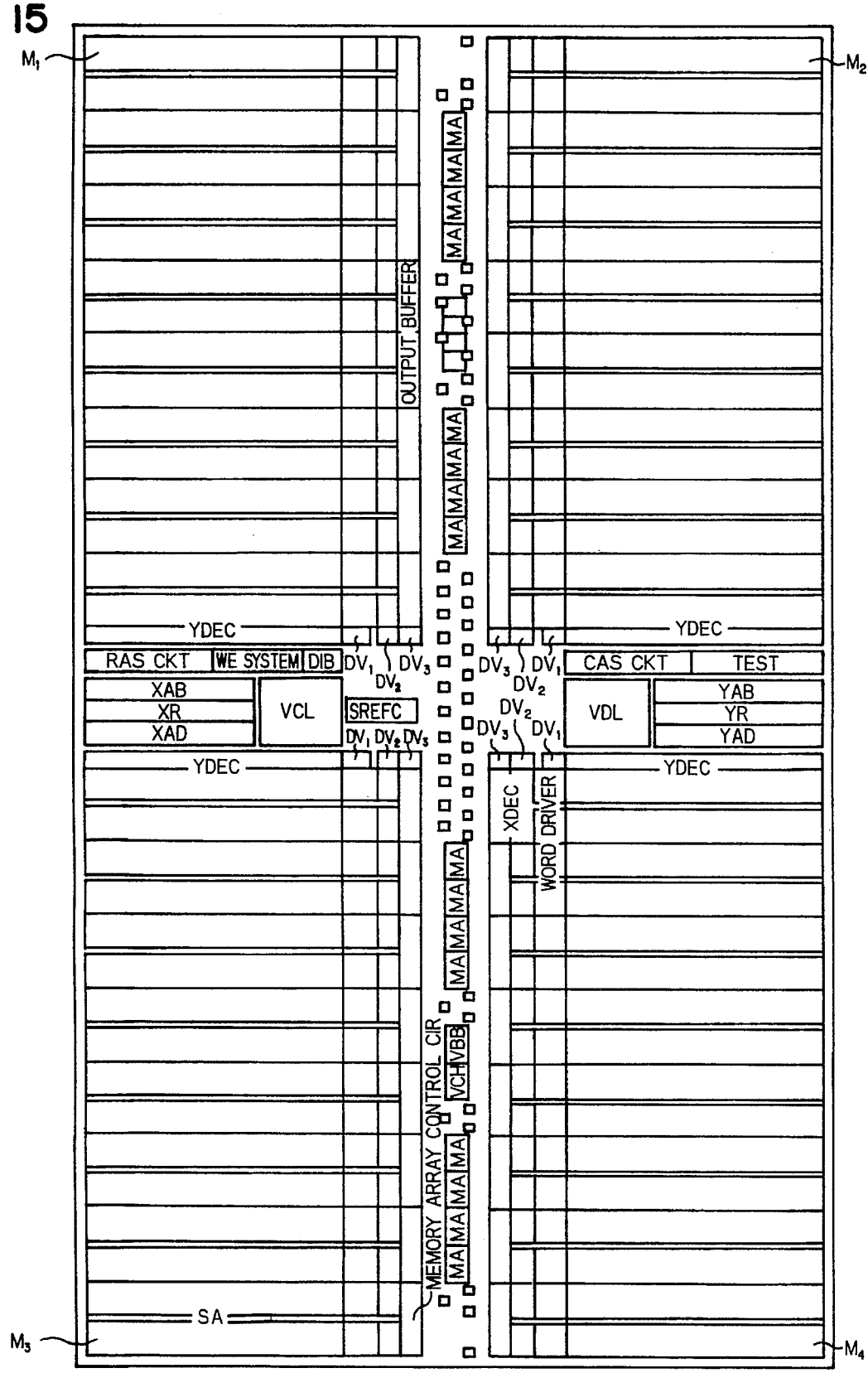
FIG. 15 is a schematic block diagram showing a dynamic RAM according to an embodiment of the present invention.

FIG. 15 shows a schematic block diagram of a dynamic type RAM to which the present invention is applied, according to an embodiment. The respective circuit blocks are fabricated on a single semiconductor substrate such as monocrystal silicon by utilizing the semiconductor integrated circuit manufacturing techniques known in the art. Each of these circuit blocks shown in FIG. 15 is drawn in accordance with a geometric layout in the actual semiconductor chip. In this specification, the term "MOSFET" implies an insulated gate type field-effect transistor (IGFET).

In this embodiment, to avoid such a delay in the operating speeds that are caused by large wiring conductor lengths for transferring various signals such as control signals and memory array drive signals due to large chip sizes and high memory capacities, the following considerations are made for the layout of the memory array section and the peripheral circuit section for performing the address selections and the like in the DRAM.

In FIG. 15, cross-shaped areas formed by a vertical center portion and a horizontal center portion within the IC chip is provided. The peripheral circuit is mainly arranged in this cross-shaped area, and the memory arrays are arranged in four areas into which the chip is divided by the cross-shaped areas. That is, there are provided cross-shaped areas at the central portion along the vertical direction and the horizontal direction within the IC chip, so that the memory arrays M1 to M4 are fabricated on the four divided areas. Although not restricted to this case, each of these four memory arrays has a storage capacity of approximately 4 M bits. In connection thereto, the overall memory capacity of these four memory arrays M1 to M4 becomes approximately 16 M bits.

One memory array is subdivided into sixteen memory units arranged where the word lines are extended in the horizontal direction. The respective sixteen memory units are arranged in such a manner that pairs of complementary bit lines (data lines, or digit lines) are arranged in parallel and extend in the vertical direction. In FIG. 15, one pair of memory units are arranged on the upper and lower sides of a sense amplifier SA. The sense amplifiers SA are arranged in a manner, so-called "shared sense amplifier system" such that each sense amplifier is commonly by one pair of memory units arranged on the upper and lower sides thereof.

At an end of each of the four divided memory arrays centrally of the substrate (chip), a Y-decoder YDEC is provided. Y selecting lines extend from the Y-decoders YDEC over a plurality of memory units of their corresponding memory arrays so as to perform the switch control of the gate electrodes of the column switch MOSFETs.

In the left-side part of the central portion of the chip, as viewed in the horizontal direction, there are provided X-circuitry including an X-address buffer XAB, an X-redundancy circuit XR and an X-address driver XAD. Further, there are provided, in the above-mentioned left-side portion, an RAS control signal circuit RASCKT, a write enable signal control circuit WESYSTEM, a data input buffer DIB, and an internal voltage dropping circuit VCL. The internal voltage dropping circuit VCL is provided near the center of this area, which produces, from an external power source voltage VCCE such as approximately 5 V, a constant voltage corresponding to a voltage such as about 3.3 V to be supplied to internal circuits.

In the right-side part of the central portion of the chip, as viewed in the horizontal direction, there are provided a Y-circuitry including an Y-address buffer YAB, an Y-redundancy circuit YR, and an Y-address driver YAD, and a CAS control signal circuit CASCKT, and also a test circuit TEST. Another internal voltage dropping circuit VDL for forming a power source voltage applied to peripheral circuits such as an address buffer and a decoder is provided at the central portion of the chip.

As described above, when these address buffers XAB and YAB, redundancy circuits XR and YR including their corresponding address comparator circuits, and the CAS/RAS control signal circuits RASCKT and CASCKT for producing control clocks are arranged at a single position in a concentrated manner, a clock generating circuit could be separated from other circuits with sandwiching wiring channels. In other words, the above-described wiring channels are utilized in common, so that higher integration could be achieved, and also the various signals may be transferred to the address drivers (logic stages) XAD and YAD with shortest and equal distances.

The RAS control circuit RASCKT is employed so as to activate the X-address buffer XAB upon receiving the row-address strobe signal $\overline{RAS}$ (RASB signal). The address signal received by the X-address buffer XAB is supplied to the X-redundancy circuit XR. In this circuit, this address signal is compared with faulty addresses, thereby judging whether or not the circuit is switched to the redundancy circuit. The comparison result and that address signal are supplied to an X-predecoder. A predecoder signal is produced in this predecoder, and is supplied via the X-address drivers XAD provided in correspondence with the respective memory arrays to the respective X-decoders XDEC provided in correspondence with the above-explained memory units.

Meanwhile, the RAS internal signal is supplied to a signal control circuit WESYS in the WE system (for the write-enabling) and a CAS control circuit CASCKT. For instance, discrimination is carried out among the auto-refreshing mode (CBR) and the test mode (WCBR) by judging an inputting order among the above-explained RASB signal, column address strobe signal $\overline{CAS}$ (CASB signal), and write-enable signal $\overline{WE}$. The self-refreshing control circuit described above may be, for example, built in at a central portion of the chip as denoted by SREFRC. In the test mode by the WCBR, the test circuit TEST is activated, whereby the test functions are set in accordance with the specific address signals supplied with respective timings in the respective test modes for the opened standard test mode and the closed test mode. A refresh counter is included in the X-address buffer.

The CAS control circuit CASCKT is used to form various Y-control signals upon receipt of the CASB signal. In synchronism with a change of the CASB signal to be at the low level, an address signal is received by the Y address buffer YAB, which is then supplied to the Y-redundancy circuit YR. This address signal is compared with faulty addresses in this redundancy circuit to judge whether or not the switching to this redundancy circuit is performed. Both of this judgement result and the address signal are supplied to a Y-predecoder. The predecoder produces a predecode signal. This predecode signal is supplied via the Y-address drivers YAD provided in correspondence with each of four memory arrays to the respective Y decoders YDEC. On the other hand, the CAS control circuit CASCKT receives the RASB signal and the WEB signal ($\overline{WE}$) to judge the test mode based upon the judgement result of the inputting order among these signals, whereby the adjoining test circuit TEST is activated.

At the upper portion of the vertical center portion of the chip, as viewed in the vertical direction, sixteen memory units and eight sense amplifiers SA are arranged in a symmetrical relationship with respect to the central axis of this area. Four main amplifiers MA are employed in correspondence with four sets of memory units and sense amplifiers on the right and left sides. The boosted voltage generating circuit VCH used to select word lines upon receipt of the internal dropped voltages, and the input pad areas corresponding to the address signals and the control signals as the input signals are provided in the vertical central upper portion.

Also, at the lower portion of the vertical center portion of the chip, as viewed in the vertical direction, sixteen memory units and eight sense amplifiers SA are arranged in a horizontally symmetrical form with respect to the central axis of this area. Four main amplifiers MA corresponding to four sets of memory units and sense amplifiers SA are provided on the right and left sides.

In addition to the above circuit members, there are provided in the vertical center portion a substrate voltage generating circuit VBB for forming a negative bias voltage to be applied to the substrate upon receipt of the internal dropped voltage, input pad areas corresponding to the input signals such as address signals and control signals, and also a data output buffer circuit "OUTPUT BUFFER". The amplified signals from the respective sense amplifiers SA can be transferred via the shorter signal transmission paths to the main amplifiers MA while employing only a small number of (e.g., four) main amplifiers MA in a similar manner to the above case.

Although not shown in FIG. 15, various sorts of bonding pads are provided in areas within the above-explained vertical center portions. As an example of these bonding pads, there are pads to supply voltages from an external power supply. To increase the input level margin, namely to lower the power source impedance, several tens of ground potential pads are employed and are arranged along a straight line. These ground potential pads are connected to ground potential leads which are fabricated by the LOC (lead-on-chip) technique and extend in the vertical direction. Among these ground potential pads, the specific pads may be provided for preventing floating effects caused by the coupling of the non-selected word lines of the word diver and by clearing the word lines, and also the pads for the common source of the sense amplifiers are mainly provided to lower the power source impedances.

As a consequence, since the power source impedance is lowered with respect to the operations of the internal circuit, and the ground lines for the internal circuits classified into plural sorts are connected by low-pass filters made of LOC lead frames and bonding wires, occurrences of noises can be suppressed to a minimum, and also propagations of noise in the circuit ground lines among the internal circuits can be suppressed to a minimum level.

In this embodiment, the pads corresponding to the external power source voltage VCC such as approximately 5V are provided in correspondence with the internal voltage dropping circuits VCL and VDC for performing the above-described voltage converting operation. These pads are employed so as to lower the power source impedance and suppress the noise propagations of noise in the voltages (VCL, VDL, VCC) among the internal circuits.

The address inputting pads and the pads for control signals $\overline{RAS}$, $\overline{CAS}$, $\overline{WE}$ (write enable) and $\overline{OE}$ (output enable) are arranged in the area of the above-described central portions. Other pads for inputting/outputting data, pads for bonding masters, pads for monitoring and monitor pad controlling pads are provided.

As the bonding master pads, there are provided such pads for designating a static column mode, and also for designating a write mask function in case of the nibble mode and×4 bits arrangement. As the monitoring pads, there are provided such pads for monitoring the internal voltages VCL, VDL, VL (supply voltage), VBB, VCH and VPL on the respective pads. The VPL monitoring pad is for judging by probing whether or not the VPL adjustment is correctly performed.

Among these internal voltages, the VCL voltage corresponds to the power supply voltage used for the peripheral circuit, e.g., approximately 3.3 V, and is produced in common by the internal dropping voltage circuit VCL. The internal voltage VDC corresponds to the power supply voltage of about 3.3 V to be applied to the sense amplifier SA, namely the memory array, and is produced by the internal drop voltage circuit VDL. The internal voltage VCH corresponds to a boosted power-source voltage used to select the selection levels of the word lines and the shared switch MOSFET, which is boosted to about 5.3 V from the above-described internal voltage VCL. The internal voltage VBB is a substrate back bias voltage of −2 V, whereas the internal voltage VPL is a plate voltage for a memory cell.

In the above-described dynamic type RAM having a self-refreshing function, both the CASB signal and the RASB signal have only to be fixed to a low level externally with the CBR timing to automatically perform the self-refreshing operation. As a consequence, such a dynamic type RAM may be very useful when employed in battery back-up systems, note-book type personal computers driven by batteries, and memory cards with battery back-up functions by the internal batteries.

The above-described embodiments enjoy various advantages as follows:

(1). A single counter circuit for counting output pulses from a basic oscillator is used in common as a first counter output detection circuit for detecting that refreshing operation mode initiation conditions set by programmable elements are satisfied, as a second counter output detection circuit for detecting that a single refreshing operation is completed for all of the memory cells and as a third counter output detection circuit for detecting a set refreshing time period. The first to third detection circuits and the counter circuit are controlled by the detecting outputs and control signals. By this, the overall structure can be considerably simplified.

(2). A useful refreshing operation mode is available owing to the fact that a CBR timing state is maintained for a predetermined time period to perform a self-refreshing mode of operation.

(3). The above-described counter circuit may be comprised of a binary counter circuit of the type in which a carry signal is asynchronously and serially transferred from one bit to the next higher order bit, and at least first and third counter output detection circuits perform counter output detection in synchronism with pulses which are produced with a time delay with respect to edges of pulses with which the counter circuit performs its counting operations wherein the pulses are delayed with respect to output pulses of a basic oscillator. By this, the stable detection outputs can be obtained with a simple circuit structure.

(4). The basic oscillator may include an odd number of CMOS inverter circuits which are operable with a very low current and are connected to each other in a ring form. By changing over among amplitudes of the low current depending on the self-refreshing operation mode, it is possible to vary the oscillation frequency in such a manner that the oscillation frequency is made lower to reduce the number of bits of the counter circuit when a long time period such as the pause time is measured, and the oscillation frequency is made higher to enhance the judgement precision when a short time period such as the set mode timing is measured.

(5). The basic oscillator may be used in common with a charge pump circuit constituting a substrate back bias voltage generating circuit or a voltage boosting circuit so that the entire circuit can be made simple under low power consumption.

While the present invention has been exemplarily described with reference to the various embodiments, the present invention should not be limited thereto, and various modifications may be made without departing from the gist of the present invention. For instance, various sorts of combinations with the control signals to set the self-refreshing operation mode may be conceived under such a condition that the signal CBR is combined with other control signals, and these combinations are maintained for more than a predetermined time period.

Various specific circuits of the basic oscillator, the binary counter circuit, and the counter judging output circuits may be conceived other than the above-described specific circuits. As the programmable elements used to set various initial values, there are many possibilities such as, laser beam-cut fuses, electrically cut fuses, circuits employing electrically disabling MOSFETs and diodes, and circuits with employment of non-volatile storage elements such as EPROM.

The present invention may be widely applicable to various types of dynamic RAMs requiring refreshing operations. The dynamic RAMs to which the present invention is applicable include those which employ the address multiplex method, or which have an input/output interface compatible with a static type RAM.

We claim:

1. A dynamic random access memory device comprising:

a basic oscillator for generating pulses;

a counter circuit for counting said pulses outputted from said basic oscillator;

a first counter output detection circuit having a first programmable circuit for setting a refresh-mode setting time, said first counter output detection circuit being responsive to a first counting output of said counter circuit for detecting a lapse of said refresh-mode setting time;

a second counter output detection circuit responsive to a second counting output of said counter circuit for detecting a completion of one refreshing cycle of operation for substantially all memory cells of the memory device;

a third counter output detection circuit having a second programmable circuit for setting a pause time, said third counter output detection circuit being responsive to a third counting output of said counter circuit for detecting a lapse of said pause time; and a control circuit, responsive to outputs of said first to third counter output detection circuits and responsive to a control signal, for controlling said first to third counter output detection circuits.

2. A dynamic random access memory device according to claim 1, wherein:

said first counter output detection circuit has means for detecting a continuation for a predetermined time of a state in which a column address strobe signal is first changed to be and held at a first level and thereafter a row address strobe signal is changed to be and held at the first level, said predetermined time being measured from a time point when said row address strobe signal is changed;

a burst refreshing is started, for said refreshing cycle of operation, responsive to a result of said detection of said continuation for a predetermined time of a state;

said third counter output detection circuit detects a lapse of said pause time since a completion of said burst refreshing to start a next burst refreshing; and either of said burst refreshing or said pause time is ceased when said row address strobe signal is changed to be at a second level.

3. A dynamic random access memory device according to claim 2, wherein said pause time is ceased responsive to one of the output of said third counter output detection circuit, a charge voltage holding state detection signal and source voltage fluctuation information, to thereby start said burst refreshing.

4. A dynamic random access memory device according to claim 1, wherein said counter circuit includes a binary counter circuit of the type in which a carry signal is transferred asynchronously and serially from one bit to a next higher order bit, and at least said first and third counter output detection circuits perform said counter output detection in synchronization with pulses generated so as to be delayed a predetermined time from pulse edges of pulses generated by said basic oscillator or pulse edges of pulses produced by delaying said pulses generated by said basic oscillator, with which pulse edges said counter circuit performs said counting.

5. A dynamic random access memory device according to claim 1, wherein said basic oscillator includes a ring shaped cascade connection of an odd number of CMOS inverter circuits operable with a low current, said low current having its amplitude changed depending upon modes of said counter output detection.

6. A dynamic random access memory device according to claim 1, wherein said basic oscillator is operated stationarily, said pulses generated by said basic oscillator being supplied to a voltage generator including a charge pump circuit, in which the pulses generated by said basic oscillator are supplied to said counter circuit through a gate circuit only for a self-refreshing mode.

7. A refreshing control circuit for use with a semiconductor memory device capable of a self-refreshing operation with a refresh-initiation signal generated in said memory device, comprising:

an oscillator for generating a basic clock pulse signal;

first means coupled to said oscillator for detecting continuation of said refresh-initiation signal at least for a predetermined threshold time duration and generating a first detection signal upon detection of said continuation, said first means having a first programmable circuit for setting said predetermined threshold time duration;

second means responsive to said first detection signal for generating refresh-timing pulses in synchronization with said basic clock pulse signal, said self-refreshing operation being effected with said refresh-timing pulses;

third means coupled to said oscillator and responsive to said first detection signal for detecting termination of one refreshing operation cycle and generating a second detection signal upon detection of said termination of the one refreshing operation cycle;

fourth means coupled to said oscillator and responsive to said second detection signal for detecting termination of a predetermined pause time duration and generating a third detection signal at least upon detection of said termination of the predetermined pause time duration; and a controller coupled to receive said first, second and third detection signals from said first, third and fourth means, respectively, for controlling said first, second, third and fourth means.

8. A refreshing control circuit according to claim 7, further comprising fifth means for monitoring a charge voltage level of a dummy cell and generating a pause stop signal when said charge voltage level of the dummy cell is decreased to below a predetermined level, said fifth means being coupled to said controller so that said controller causes said fourth means to produce said third detection signal upon reception of said pause stop signal from said fifth means.

9. A refreshing control circuit according to claim 7, further comprising sixth means for monitoring a level of a source voltage for said memory device and generating a pause stop signal when said source voltage level fluctuates, said sixth means being coupled to said controller so that said controller causes said fourth means to produce said third detection signal upon reception of said pause stop signal from said sixth means.

10. A refreshing control circuit according to claim 7, in which said first means, said third means and said fourth means are constituted by a binary counter circuit having plural bits, said first means being comprised of relatively lower order bits, said fourth means being comprised of relatively higher order bits, and said third means being comprised of at least one bit between said relatively higher order bits and said lower order bits.

11. A refreshing control circuit according to claim 7, in which said oscillator includes means for changing a repetition frequency of said basic clock pulse signal under control of said controller.

12. A semiconductor memory device having a refreshing control circuit as defined in claim 7.

* * * * *